(12) United States Patent
Lee

(10) Patent No.: US 8,399,319 B2
(45) Date of Patent: Mar. 19, 2013

(54) SEMICONDUCTOR DEVICE AND METHOD FOR MANUFACTURING THE SAME

(75) Inventor: Sang Soo Lee, Gyeonggi-do (KR)

(73) Assignee: Hynix Semiconductor Inc., Icheon-Si (KR)

( * ) Notice: Subject to any disclaimer, the term of this patent is extended or adjusted under 35 U.S.C. 154(b) by 207 days.

(21) Appl. No.: 12/839,291

(22) Filed: Jul. 19, 2010

(65) Prior Publication Data
US 2011/0260225 A1 Oct. 27, 2011

(30) Foreign Application Priority Data

Apr. 21, 2010 (KR) .................. 10-2010-0036936

(51) Int. Cl.
*H01L 21/00* (2006.01)
(52) U.S. Cl. ........ 438/206; 438/212; 438/262; 257/296; 257/E27.02

(58) Field of Classification Search .................. 438/206, 438/212, 262; 257/296, E27.02
See application file for complete search history.

(56) References Cited

U.S. PATENT DOCUMENTS

| 5,637,522 | A * | 6/1997 | Ikemasu ................ 438/396 |
| 6,451,651 | B1 * | 9/2002 | Park et al. .............. 438/253 |
| 6,680,254 | B2 * | 1/2004 | Sun et al. .............. 438/700 |
| 7,378,702 | B2 * | 5/2008 | Lee ...................... 257/296 |
| 2009/0168491 | A1 * | 7/2009 | Schricker et al. ....... 365/148 |

FOREIGN PATENT DOCUMENTS

| KR | 1020100007926 A | 1/2010 |
| WO | WO 2009/088888 A2 | 7/2009 |

\* cited by examiner

*Primary Examiner* — Jarrett Stark
*Assistant Examiner* — Nicholas Tobergte

(57) ABSTRACT

A semiconductor device includes a substrate and a plurality of unit cells vertically arranged on the substrate.

16 Claims, 19 Drawing Sheets

SEMICONDUCTOR DEVICE AND METHOD FOR MANUFACTURING THE SAME

CROSS-REFERENCE TO RELATED APPLICATION

The priority of Korean patent application No. 10-2010-0036936 filed on Apr. 21, 2010, the disclosure of which is hereby incorporated in its entirety by reference, is claimed.

BACKGROUND OF THE INVENTION

Embodiments of the present invention relate to a method for manufacturing a highly-integrated semiconductor device, and more particularly to a semiconductor device including a cell array where unit cells are vertically stacked in a multi-layered structure and a method for forming the semiconductor device.

A semiconductor memory device for use in a system comprised of several semiconductor devices has been used to store data therein. If a data processing device, e.g., a central processing unit (CPU), transmits a request of data, a semiconductor memory device outputs stored data corresponding to an address input from the data processing device, or stores data provided from the data processing device at a specific position corresponding to the address.

As the data storage capacity of the semiconductor memory device is increased, the size of a plurality of unit cells is gradually decreased, and the sizes of several constituent elements for read/write operations of data are also reduced. Therefore, assuming that there are no unnecessary overlapped wirings or transistors in the semiconductor memory device, it is important to minimize areas occupied by individual elements. In addition, reducing the size of unit cells contained in the semiconductor memory device is important to increase an integration degree of the semiconductor memory device.

A representative method for reducing production costs of the semiconductor memory device as well as increasing a profit of a manufacturing company is by increasing the integration degree of the semiconductor memory device. This is because the integration degree of the semiconductor memory device relates to how many chips can be formed on a single wafer. The semiconductor memory device includes a cell region including a plurality of unit cells, and the size of the cell region occupies a significant part of the entire size of the semiconductor memory device. The smaller the size of the unit cell, the smaller the entire size of the semiconductor memory device.

A general semiconductor memory device includes an $8F^2$- or $6F^2$-sized unit cell, wherein 'F' is a minimum line width or a minimum distance between patterns according to a specific design rule. According to the same design rule, the $6F^2$-sized unit cell is smaller than the $8F^2$-sized unit cell. As the semiconductor fabrication technology has been developed, F has been gradually reduced. However, the reduction of design rules is reaching the limit, and high costs are required to develop the fabrication technology for simplifying the design rule and products associated with the developed technology.

In recent times, a semiconductor memory device including a $4F^2$- or $2F^2$-sized unit cell has been proposed. The $2F^2$-sized unit cell is about two times smaller than the $4F^2$-sized unit cell, and is about four times smaller than the $8F^2$-sized unit cell. As a result, the semiconductor memory device including the $2F^2$-sized unit cell can be made in a smaller area even under the fabrication condition of the same design rule as those of other-sized semiconductor memory devices, and the competitiveness of the semiconductor memory device in international markets can be strengthened.

BRIEF SUMMARY OF THE INVENTION

Embodiments of the present invention are directed to providing a highly-integrated semiconductor device that substantially obviates one or more problems due to limitations and disadvantages of the related art.

Embodiments of the present invention provides a semiconductor device for vertically arranging a plurality of unit cells in a multi-layered structure, each of the unit cells including a transistor and a capacitor formed on a semiconductor substrate such that the size of the unit cell can be greatly reduced, and a method for manufacturing the same.

Embodiments of the present invention provide a semiconductor device manufacturing method for vertically arranging a plurality of unit cells on a semiconductor substrate to form a multi-layered structure.

In accordance with an aspect of the present invention, a method for manufacturing a semiconductor device includes: forming a plurality of unit cells to be vertically arranged on a semiconductor substrate.

The semiconductor substrate may be a substrate which includes an insulation layer formed between a plurality of silicon layers.

The substrate may be a silicon on insulator (SOI) substrate.

The substrate may include an insulation region formed by implanting ions at a predetermined depth of the silicon substrate.

The plurality of unit cells may include a first unit cell formed at a lower part of a bit line and a second unit cell formed at an upper part of the bit line, the first unit cell and the second unit cell being configured in a form of a double-layered structure.

Each of the first unit cell and the second unit cell may occupy a $4F^2$-sized planar area, and the first unit cell and the second unit cell may be formed at an overlap area on the semiconductor substrate.

The forming of the plurality of unit cells may include: forming a first unit cell over the semiconductor substrate; forming a bit line over the first unit cell; and forming a second unit cell over the bit line.

The forming of the first unit cell over the semiconductor substrate may include: forming a first capacitor over the semiconductor substrate; and forming a first transistor of a vertical type over the first capacitor.

The forming of the first capacitor may include: forming a plurality of electrically isolated silicon pillars by etching the semiconductor substrate; forming dielectric layers at the silicon pillars; and depositing a conductive material between the dielectric layers.

The forming of the first unit cell over the semiconductor substrate may include forming an insulation layer between the first capacitor and the first transistor.

The forming of the vertical-type first transistor over the first capacitor may include: exposing the silicon pillars by etching the insulation layer; forming a first channel region through an epitaxial growth from the silicon pillars; forming a gate oxide layer enclosing a sidewall of the first channel region; and forming a first word line enclosing the gate oxide layer.

The forming of the bit line over the first unit cell may include: depositing an insulation layer over the first unit cell; and forming a trench in the insulation layer, and burying a conductive material in the trench.

The forming of the bit line over the first unit cell may include: depositing an insulation layer over the first unit cell; forming a plurality of conductive layers over the insulation layer; and patterning the plurality of conductive layers, and depositing an insulation material.

The forming of the second unit cell over the bit line may include forming a bit line contact for coupling the first unit cell and the second unit cell to the bit line.

The forming of the second unit cell over the bit line may include: forming a second transistor of vertical type over the bit line; forming an insulation layer over the second transistor; and forming a second capacitor coupled to the second transistor over the insulation layer.

A planar area and a height of the second capacitor are adjusted such that the second capacitor has the same capacitance as that of the first capacitor.

The forming of the vertical-type second transistor over the bit line may include: exposing the first unit cell by forming a hole penetrating the bit line; forming a second channel region buried in the hole through an epitaxial growth from the first unit cell; and forming a second gate oxide layer enclosing the second channel region and a second word line at an upper part of the bit line.

The forming of the second capacitor coupled to the second transistor over the insulation layer may include: forming a contact hole exposing the second channel region by etching the insulation layer; forming a silicon pillar buried in the contact hole through an epitaxial growth from the second channel region; removing the remaining insulation layer; forming a dielectric layer on the silicon pillar; and depositing a conductive material on the dielectric layer, and thus forming an electrode.

The forming of the second capacitor coupled to the second transistor over the insulation layer may include: forming a contact hole exposing the second channel region by etching the insulation layer;

depositing a conductive material at a sidewall and bottom of the contact hole, and forming a first electrode; removing the insulation layer, and depositing a dielectric layer over the first electrode; and depositing a conductive material over the dielectric layer, and forming a second electrode.

In accordance with another aspect of the present invention, a semiconductor device includes a cell array in which two unit cells are configured in a double-layered structure on a semiconductor substrate.

The two unit cells may include a first unit cell formed at a lower part of a bit line and a second unit cell formed at an upper part of the bit line.

A contact for coupling the first and second unit cells to the bit line may penetrate the bit line.

Each of the first unit cell and the second unit cell may occupy a $4F^2$-sized planar area, and the first unit cell and the second unit cell may be overlapped with each other on the semiconductor substrate.

The first unit cell may include a first capacitor and a first transistor formed over the first capacitor, and the second unit cell may include a second transistor and a second capacitor formed over the second transistor.

The first capacitor and the second capacitor may have the same capacitance.

Each of the first transistor and the second transistor may be a vertical-type transistor which includes a channel region vertically formed over the semiconductor substrate and a gate pattern enclosing the channel region.

The two unit cells may be vertically arranged on the semiconductor substrate, and share a bit line.

The semiconductor substrate may be a silicon on insulator (SOI) substrate including an insulation layer or a bulk silicon substrate including an insulation region, and the two unit cells may be formed over the insulation layer and the insulation region.

It is to be understood that both the foregoing general description and the following detailed description of the present invention are exemplary and explanatory and are intended to provide further explanation of the invention as claimed:

DESCRIPTION OF EMBODIMENTS

Reference will now be made in detail to the embodiments of the present invention, examples of which are illustrated in the accompanying drawings. Wherever possible, the same reference numbers will be used throughout the drawings to refer to the same or like parts.

Embodiments of the present invention provides a semiconductor memory device including a unit cell smaller than that of a conventional semiconductor memory device, resulting in an increased integration degree, and a method for manufacturing the semiconductor memory device. The semiconductor memory device and the method for manufacturing the same according to the embodiments of the present invention will hereinafter be described with reference to the appended drawings.

Figure 1A:
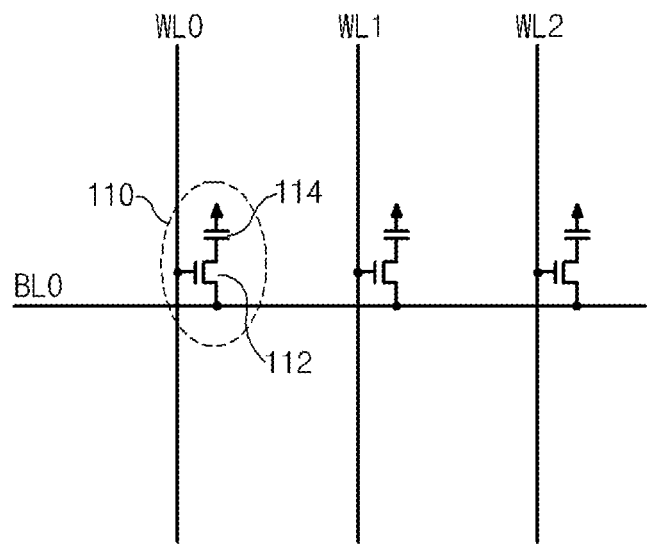
FIG. 1A is a circuit diagram illustrating a general semiconductor memory device.
Figure 1B:
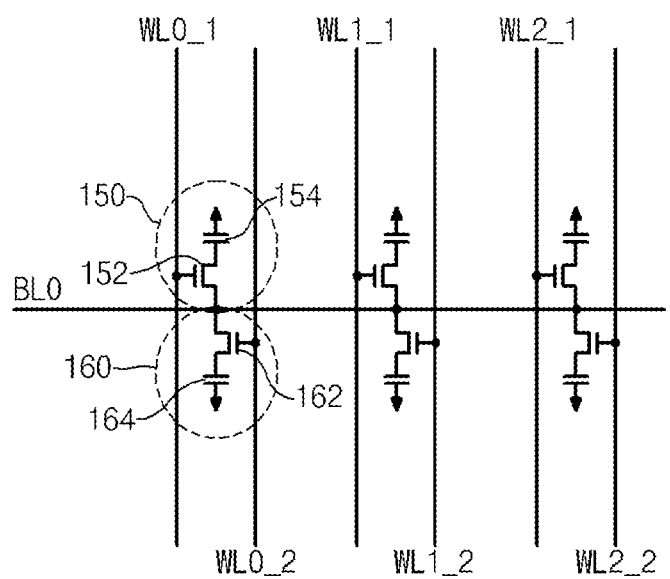
FIG. 1B is a circuit diagram illustrating a semiconductor memory device according to an embodiment of the present invention.

FIG. 1A is a circuit diagram illustrating a general semiconductor memory device, and FIG. 1B is a circuit diagram illustrating a semiconductor memory device according to an embodiment of the present invention. In more detail, FIG. 1A is a circuit diagram illustrating a unit cell for use in a general semiconductor memory device, and FIG. 1B is a circuit diagram illustrating a unit cell for use in a semiconductor memory device according to an embodiment of the present invention.

Referring to FIG. 1A, each unit cell 110 contained in the semiconductor memory device includes a cell transistor 112 formed over a semiconductor substrate and a capacitor 114 formed over the cell transistor 112. In fact, the cell transistor 112 contained in each unit cell 110 is coupled to a word line WL0 and a bit line BL0. A plurality of cell transistors 112 are apart from one another at predetermined intervals on the semiconductor substrate, and formed at substantially the same height on the semiconductor substrate. In addition, the capacitor 114 is formed at substantially the same height as that of the cell transistor 112 on the semiconductor substrate.

Referring to FIG. 1B, unit cells 150 and 160 contained in the semiconductor memory device according to an embodiment of the present invention are not arranged at substantially the same height but vertically arranged over a semiconductor substrate. In other words, the first unit cell 160 is formed over the semiconductor substrate, and the second unit cell 150 is formed over the first unit cell 160. The first unit cell 160 and the second unit cell 150 are commonly coupled to a bit line BL0. For example, a first capacitor 164 forming the first unit cell 160 is formed over the semiconductor substrate, and a first cell transistor 162 is formed over the first capacitor 164. The common bit line BL0 is formed over the first cell transistor 162, a second cell transistor 152 forming the second unit cell 150 is formed over the common bit line BL0, and a second capacitor 154 is formed over the second cell transistor 152. In other words, according to a method for manufacturing the semiconductor memory device according to the embodiment of the present invention, a plurality of unit cells are horizontally arranged on the semiconductor substrate, and also vertically arranged on the semiconductor substrate.

In accordance with the above-mentioned embodiment, a cell array contained in the semiconductor memory device may have a double-layered structure in which unit cells are respectively arranged in upper and lower layers. This is different from the conventional cell array in which several unit cells are formed and arranged at the same layer, the cell array according to the embodiment of the present invention has the double-layered structure, and thus it is able to form two unit cells on a plane where one unit cell is generally formed. In the double-layer structure, a first unit cell formed at an upper layer and a second unit cell formed at a lower layer should be accessed independently of each other, such that a word line is formed in each of the upper layer and the lower layer. However, differently from the word line, the unit cells respectively formed in the upper and lower layers can share a bit line, such that the bit line is formed between one unit cell (hereinafter referred to as an upper unit cell) formed at the upper layer and the other unit cell (hereinafter referred to as a lower unit cell) formed at the lower layer. In the double-layered cell array, a capacitor contained in the lower unit cell is characterized by a silicon pillar (formed by etching a silicon substrate) which is used as a one-sided electrode. A capacitor contained in the upper unit cell can be implemented as a cylinder-shaped capacitor formed over a transistor.

A method for forming a cell array in which a plurality of unit cells can be vertically arranged according to one embodiment of the present invention will hereinafter be described with reference to the annexed drawings.

Figure 2A:
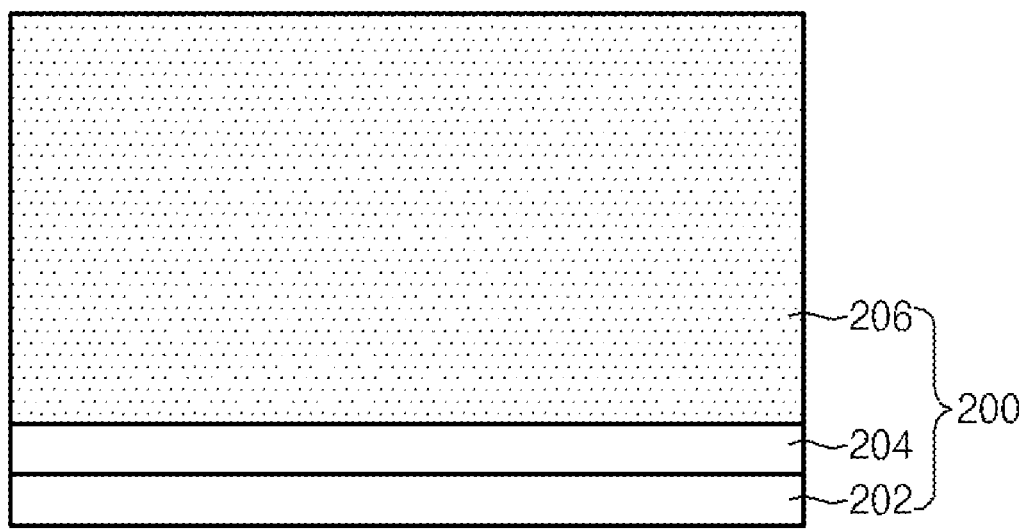
FIGS. 2A to 2Q are plan views and cross-sectional views illustrating a method for manufacturing a semiconductor memory device according to an embodiment of the present invention.
Figure 2B:
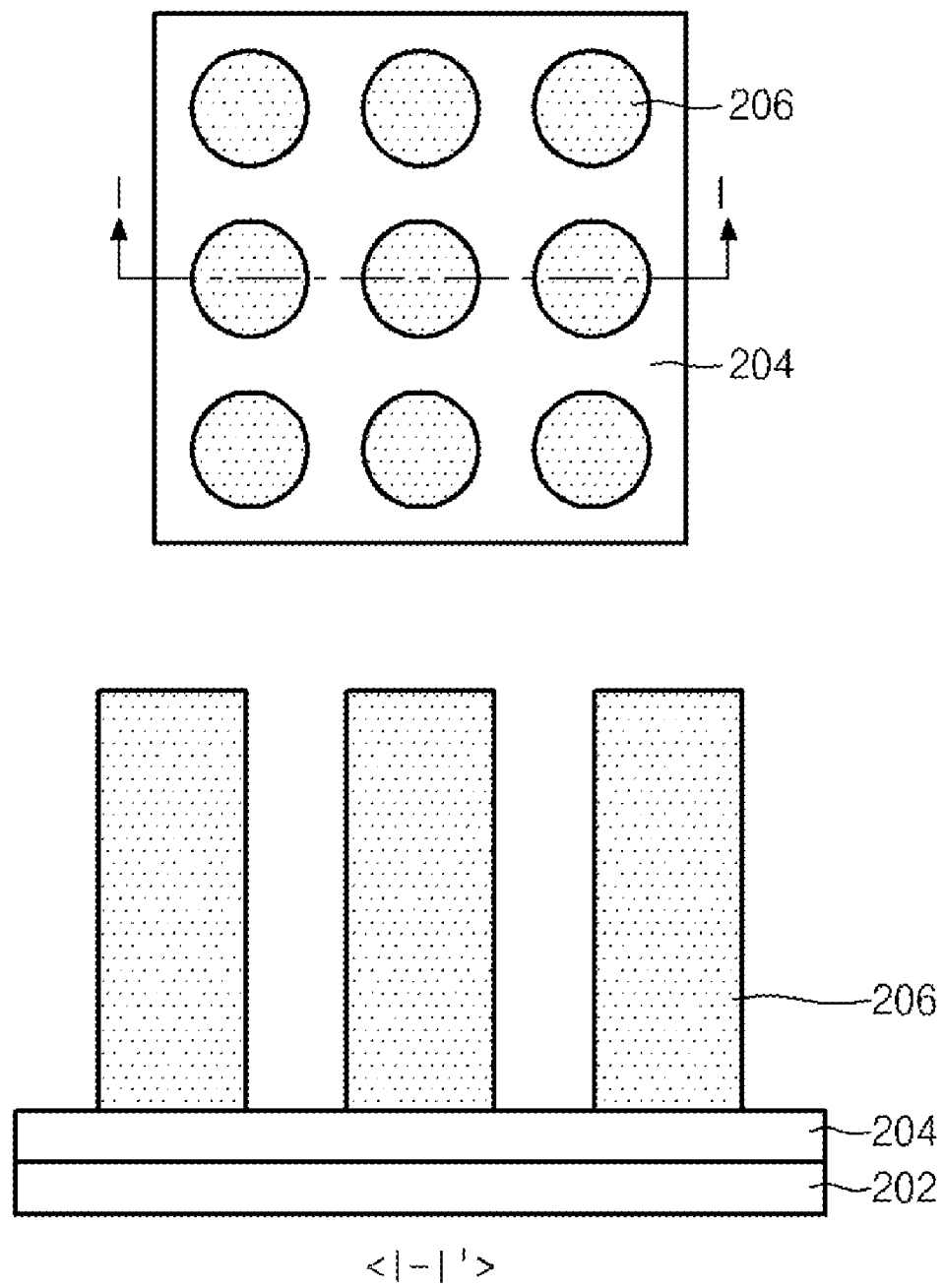
Figure 2C:
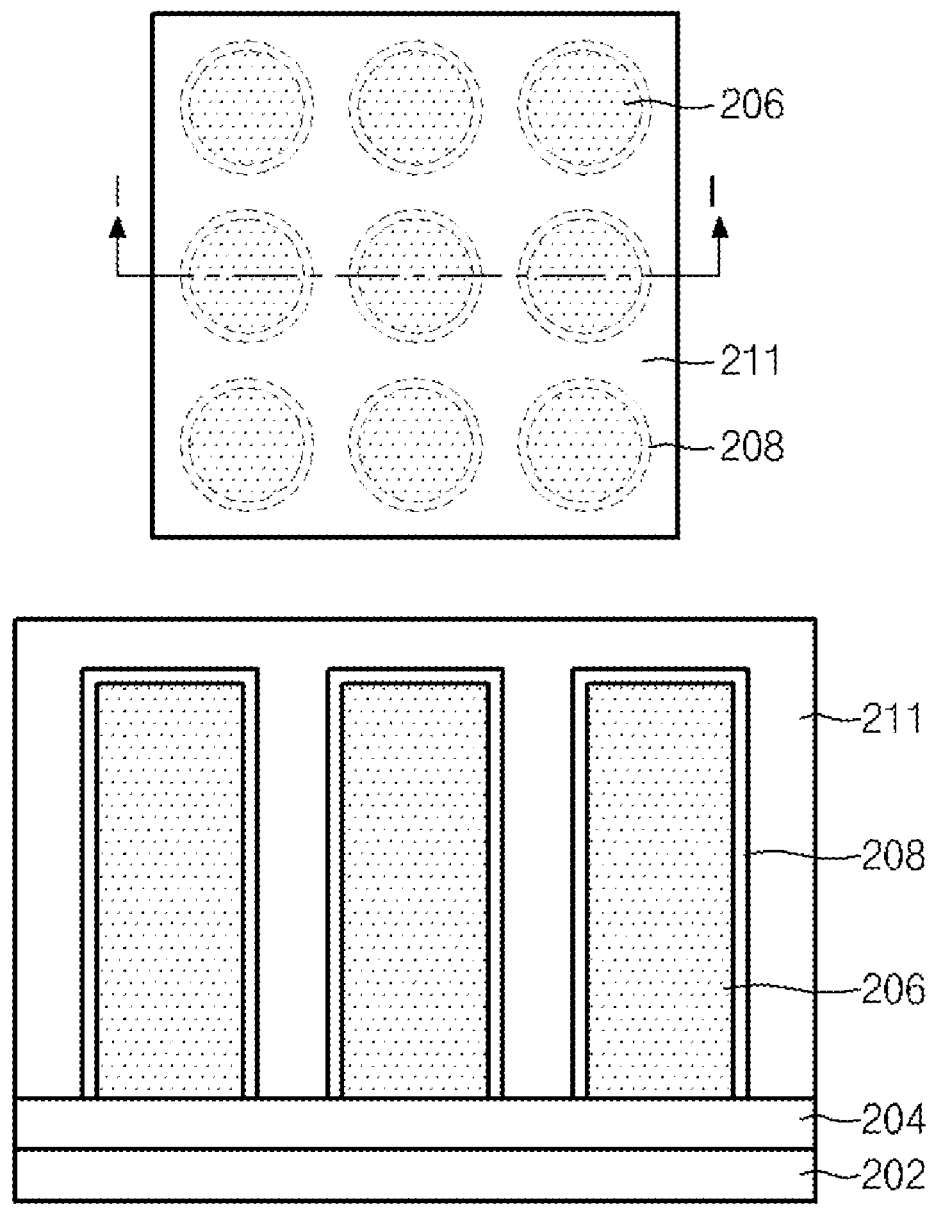
Figure 2D:
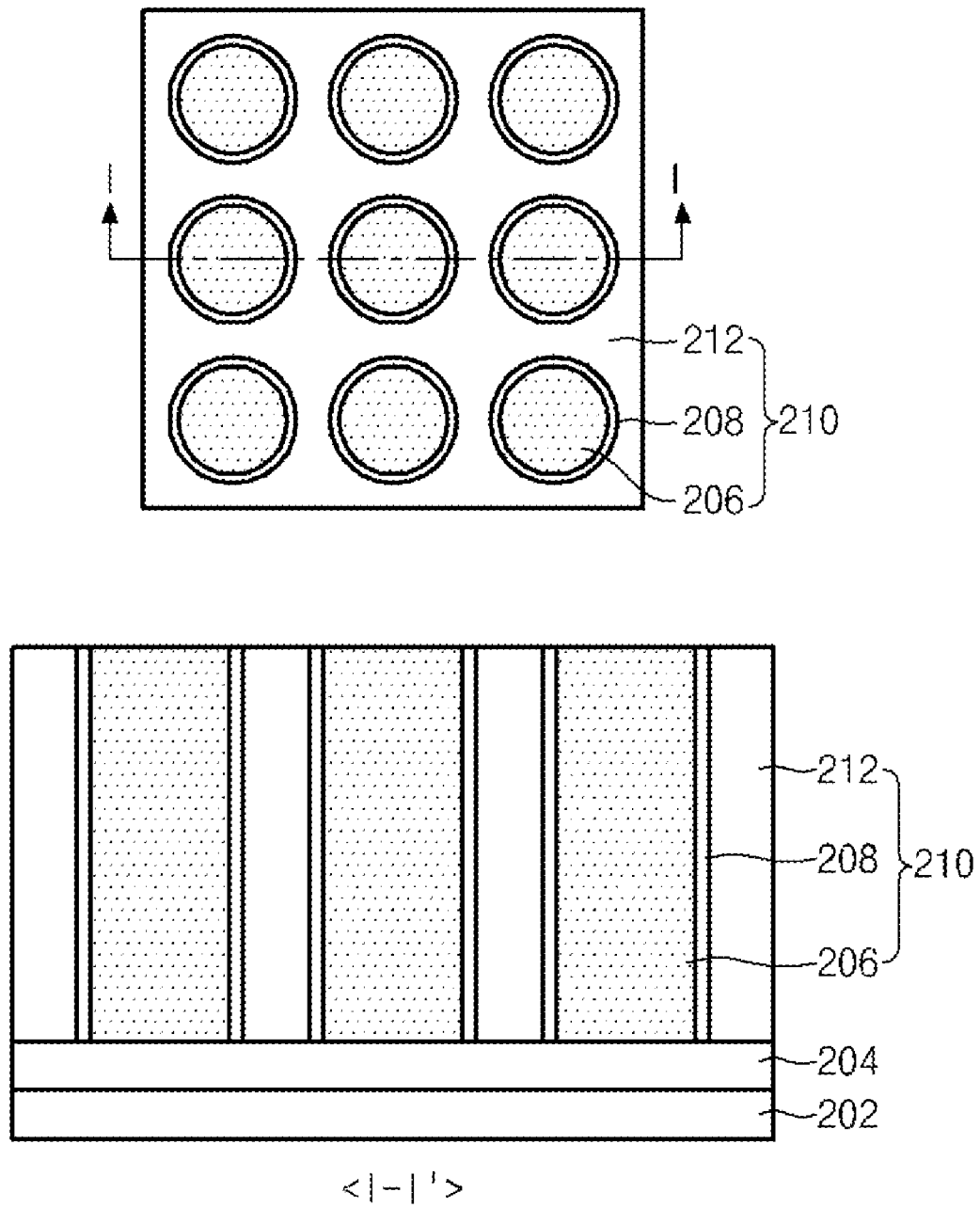
Figure 2E:
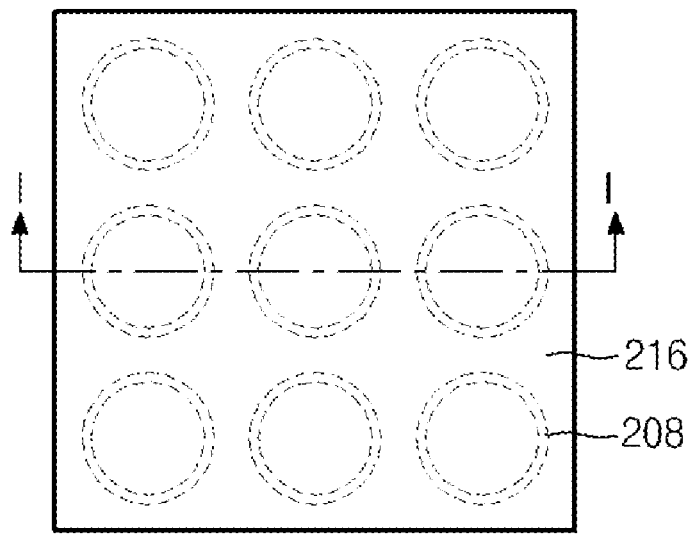
Figure 2E:
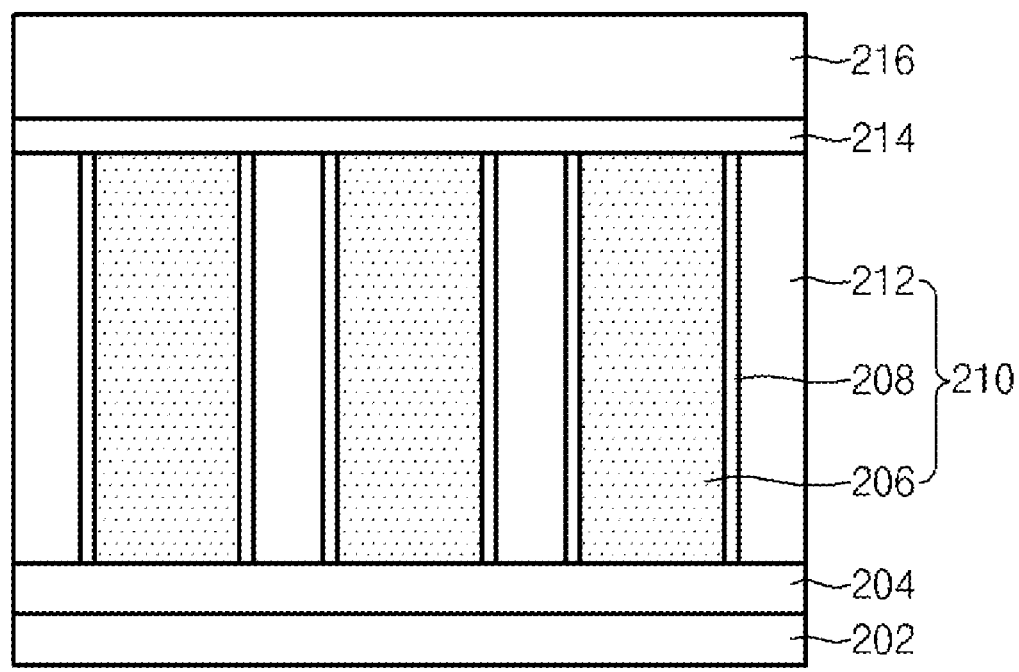
Figure 2F:
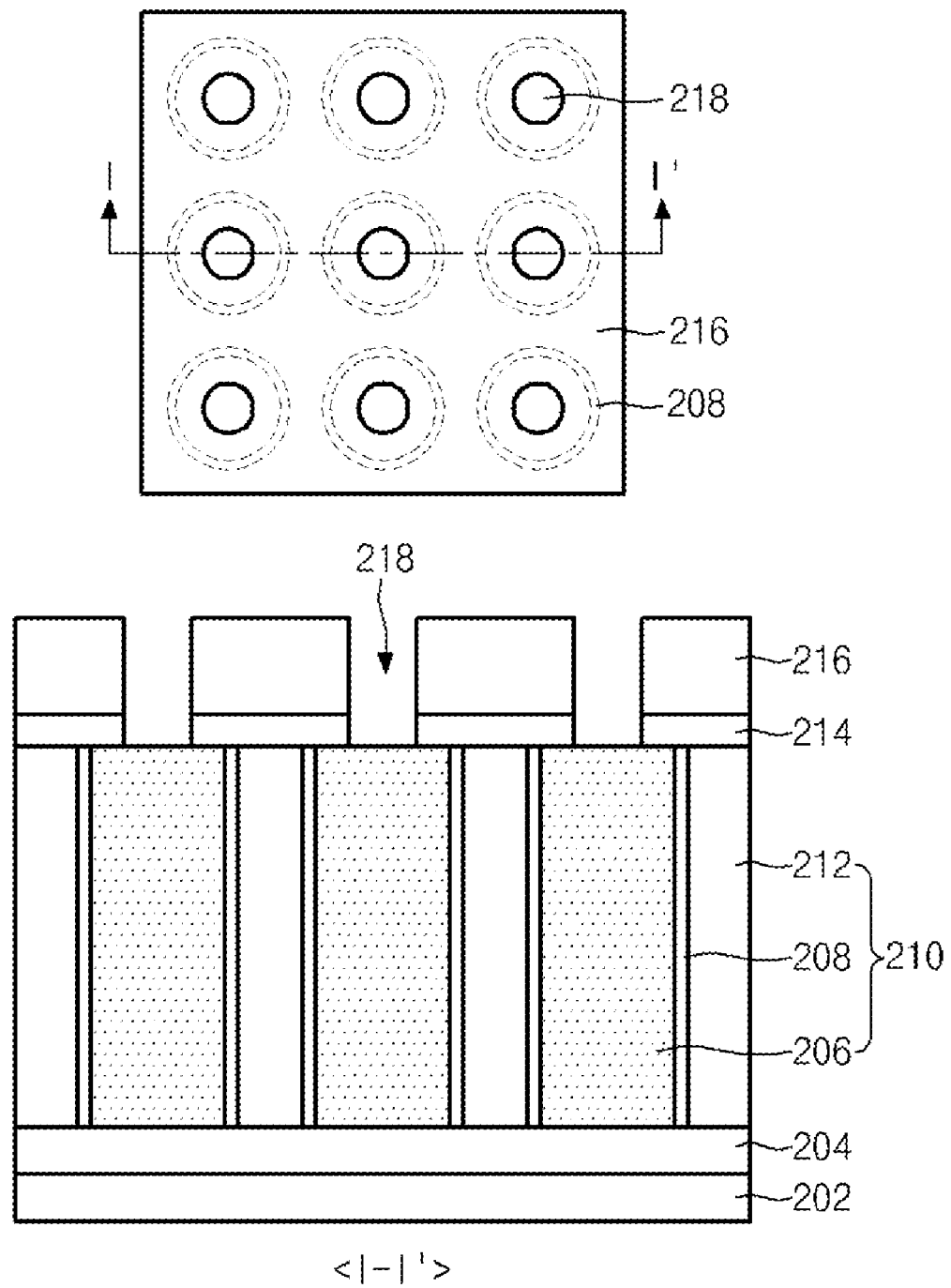
Figure 2G:
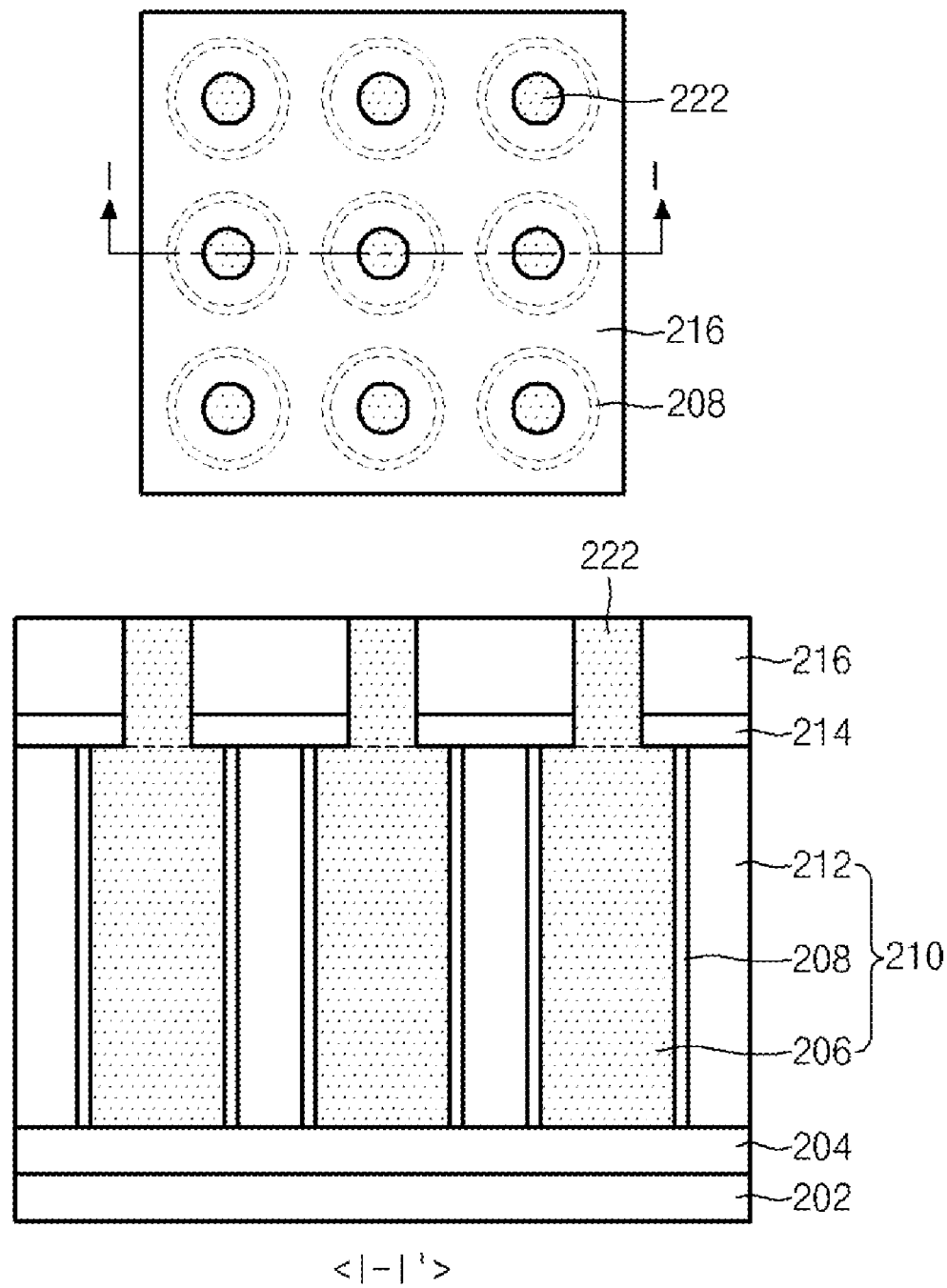
Figure 2H:
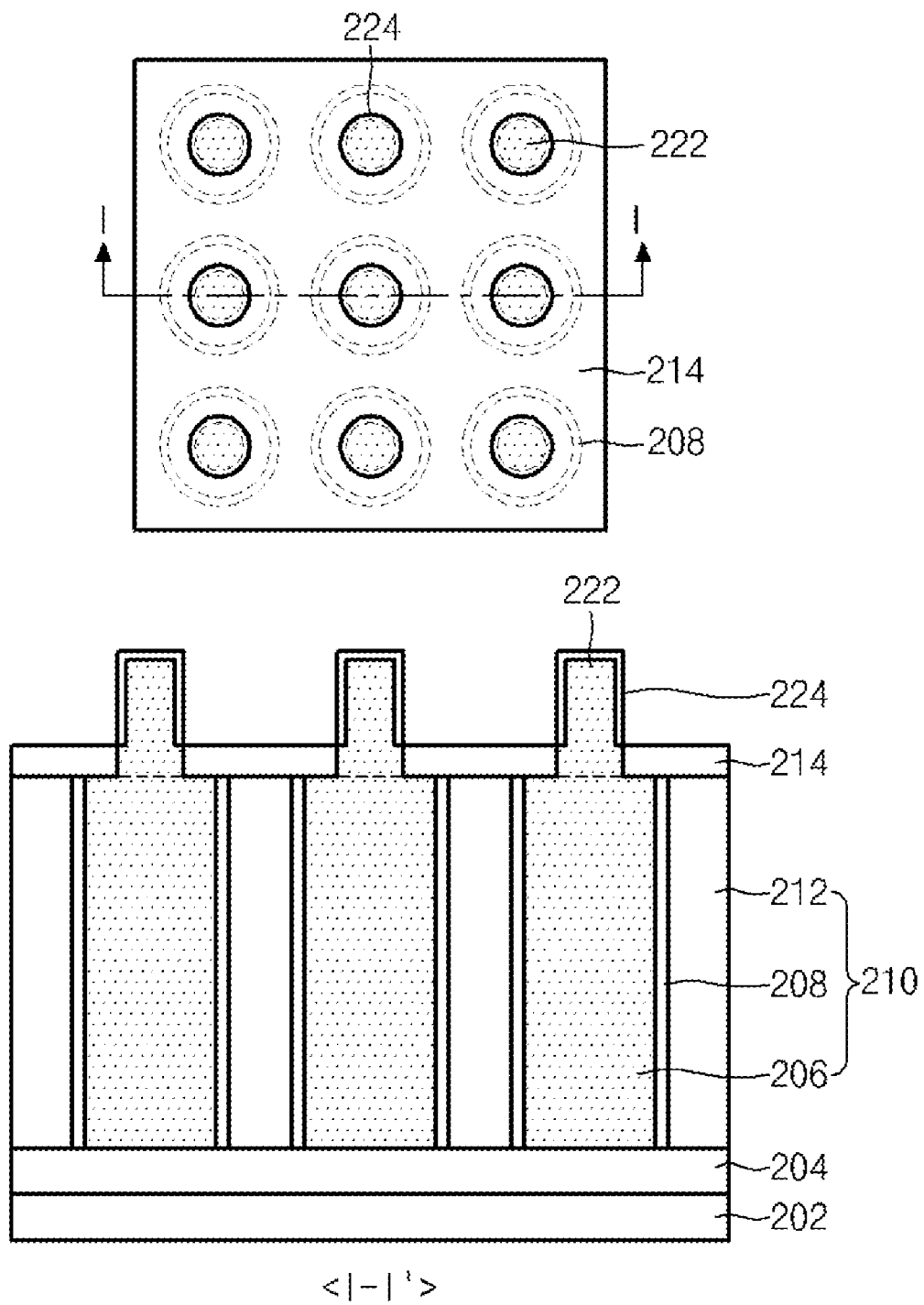
Figure 2I:
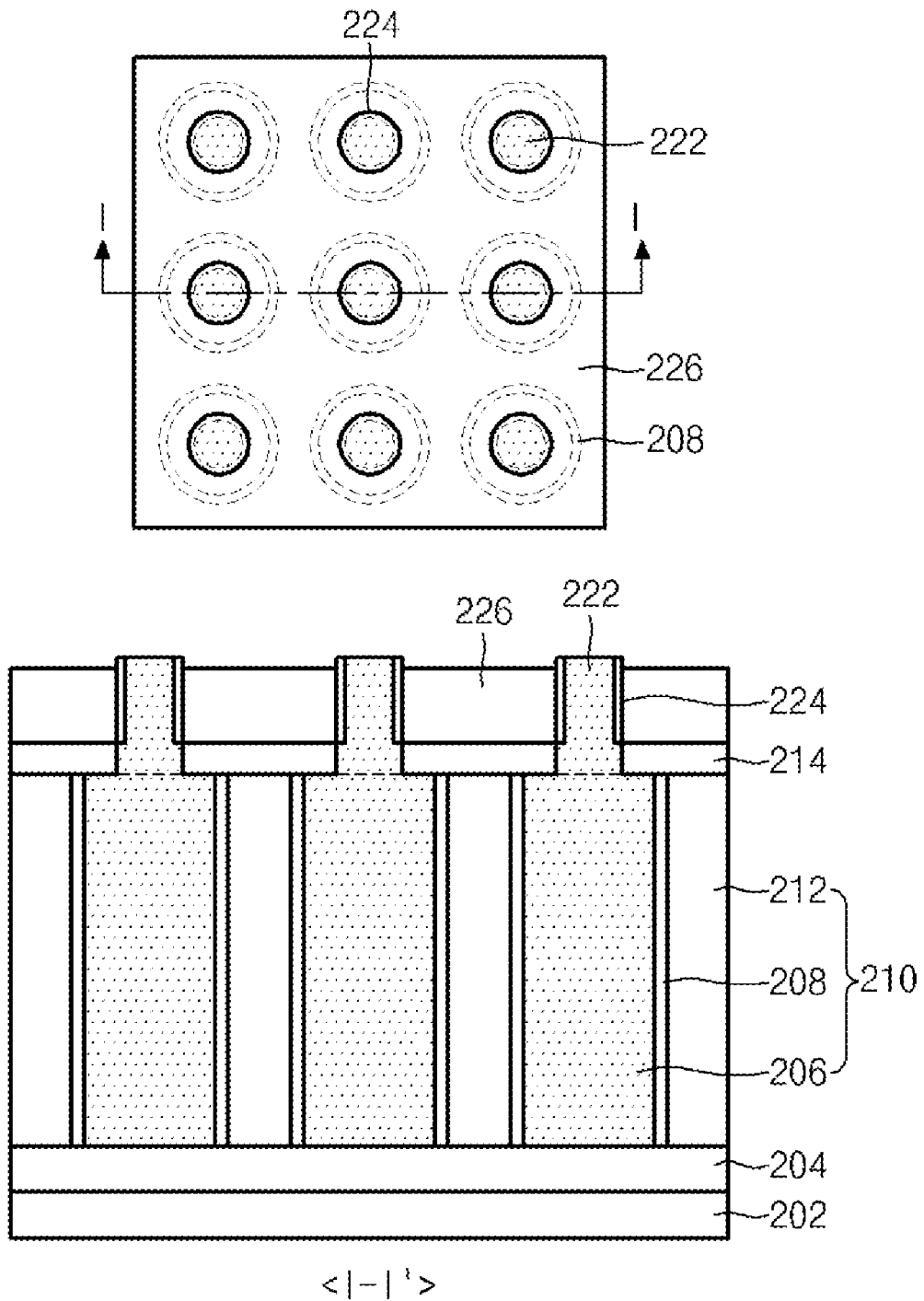
Figure 2J:
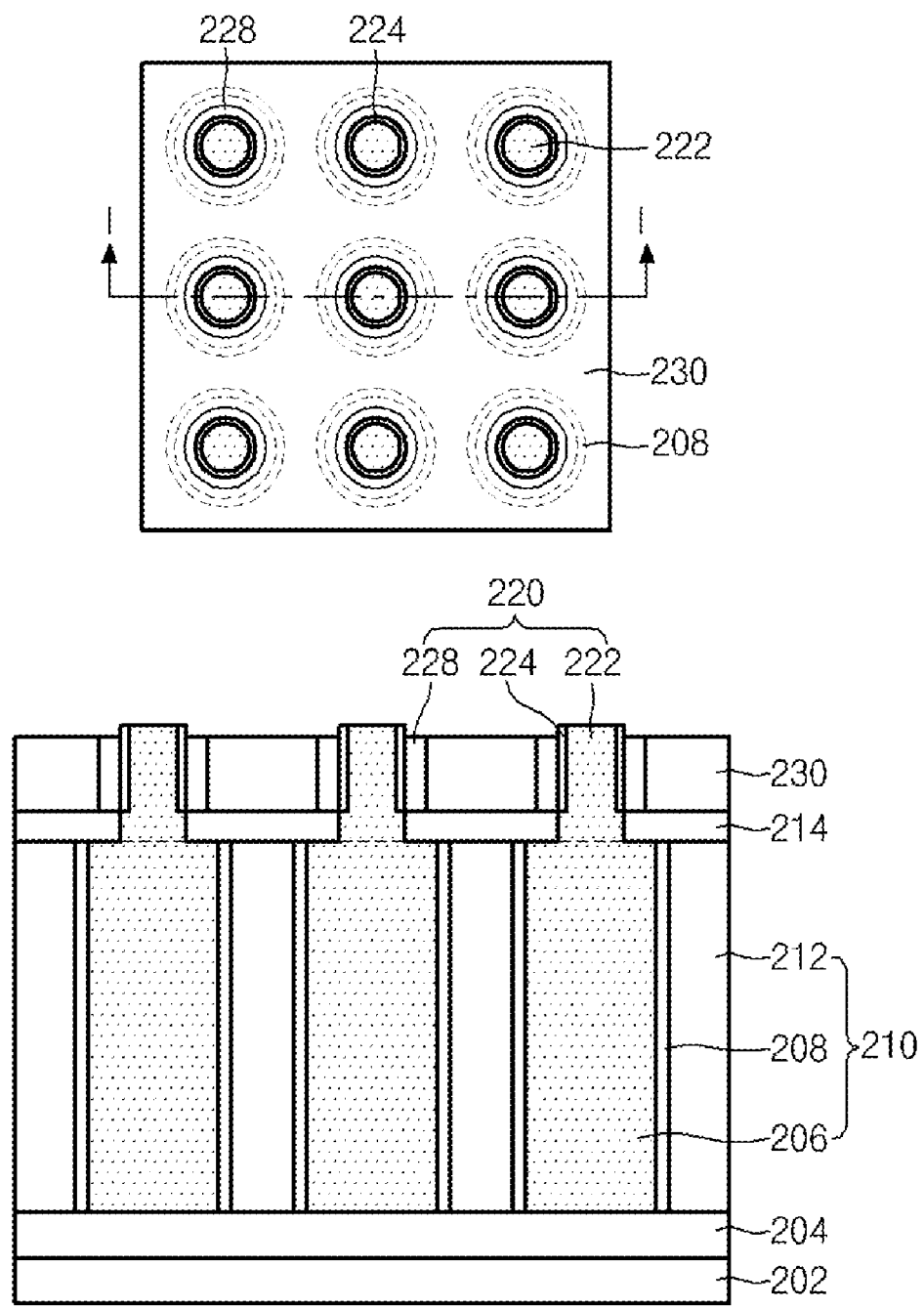
Figure 2K:
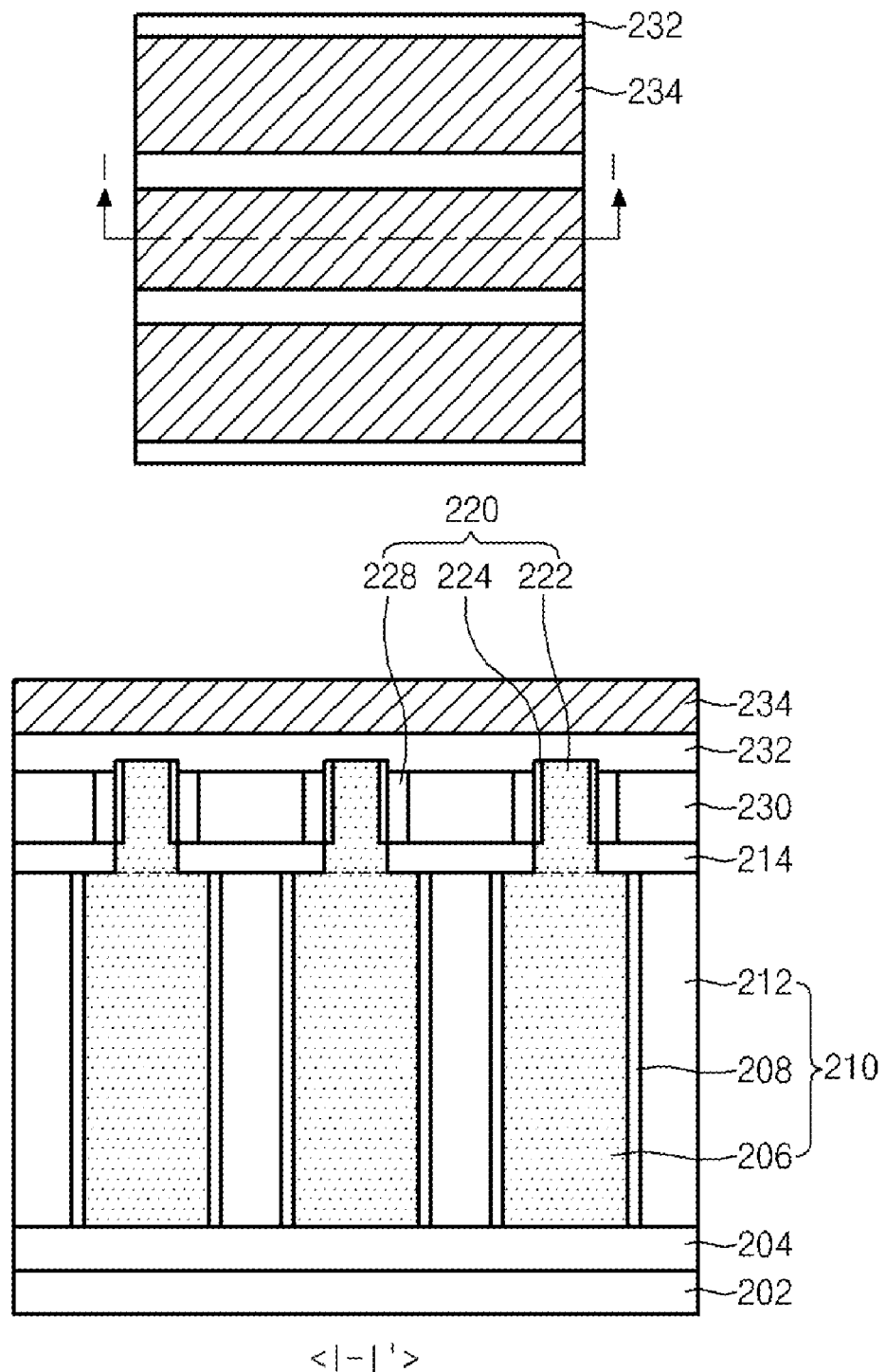
Figure 2I:
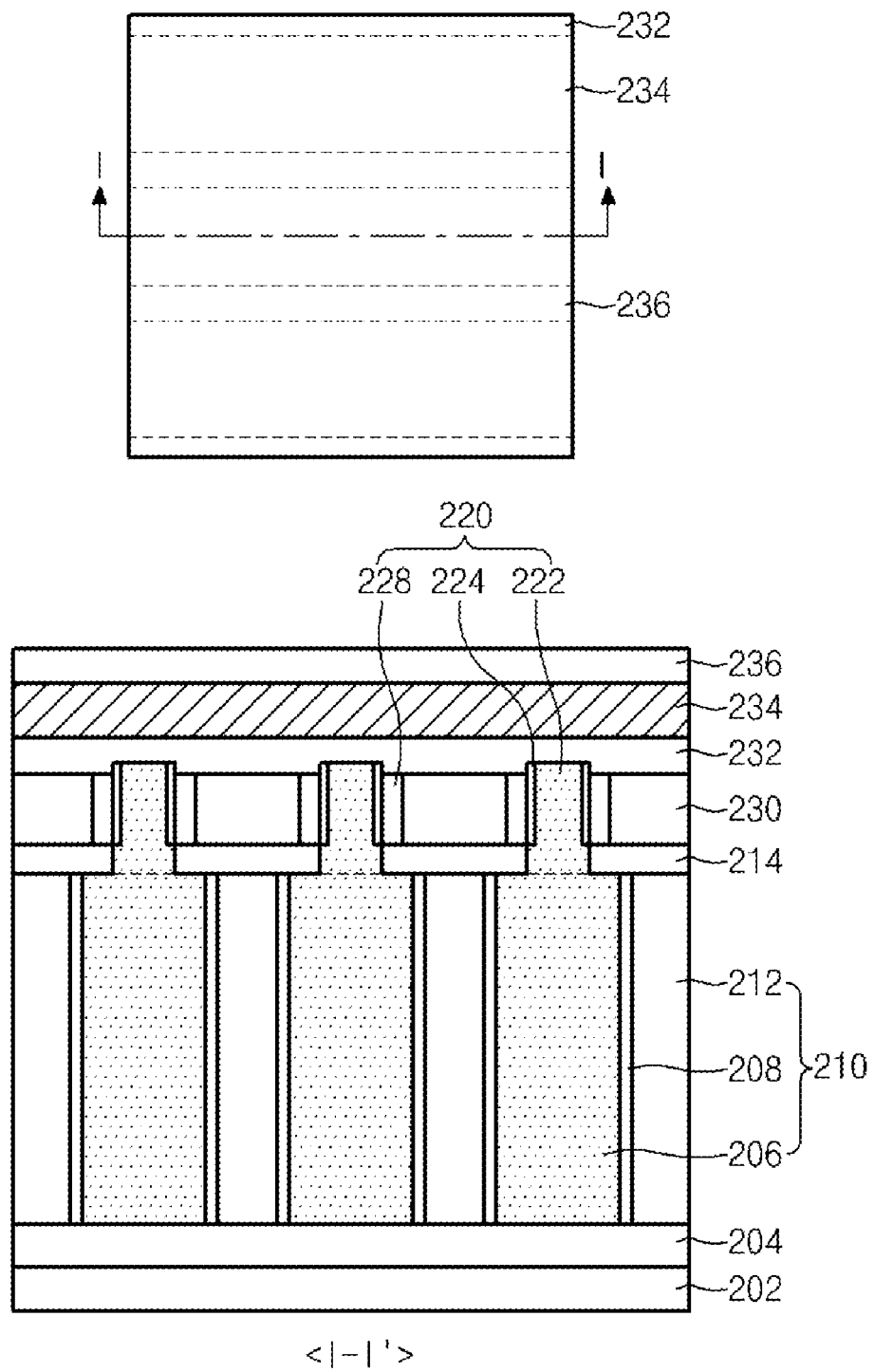
Figure 2M:
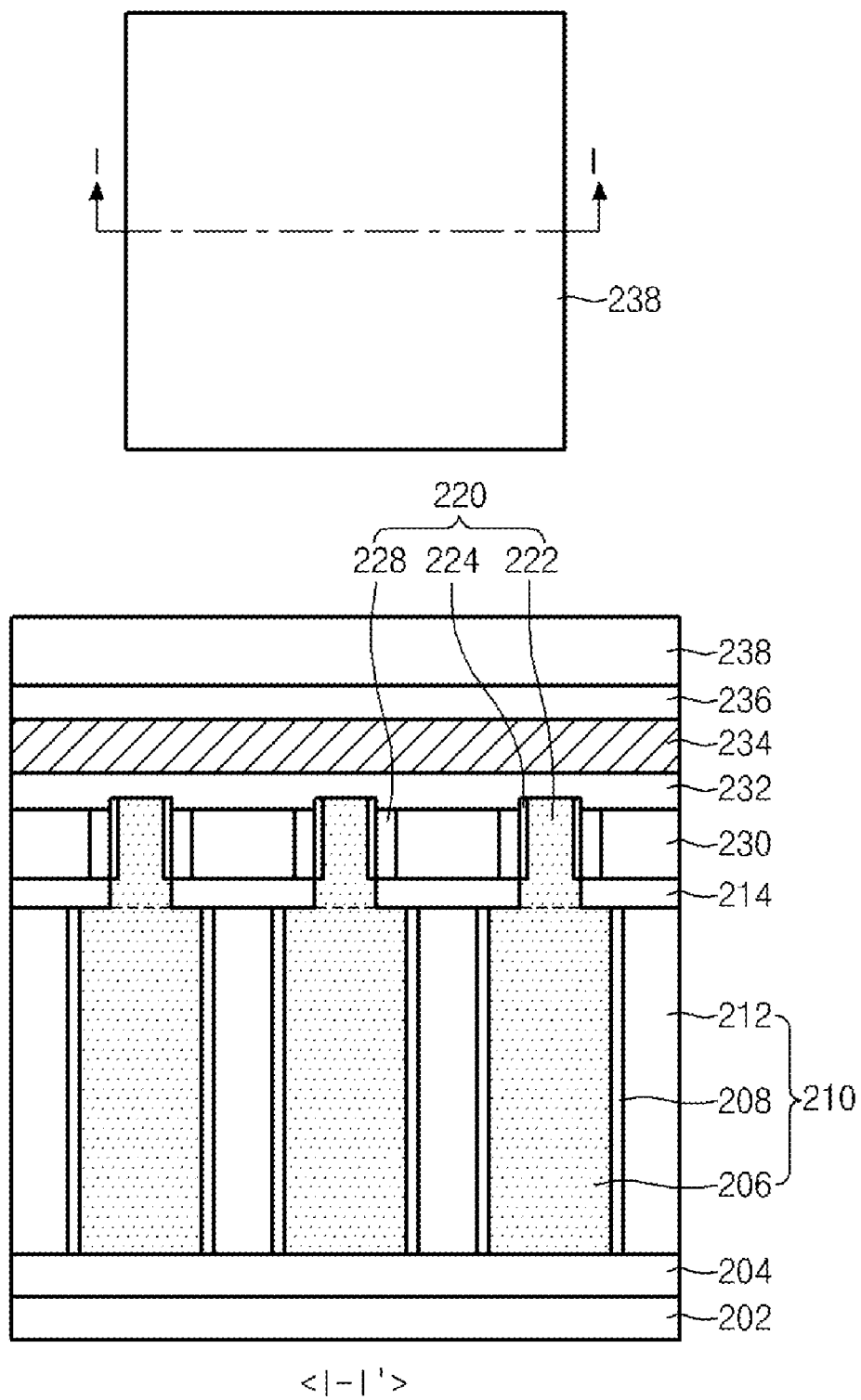
Figure 2N:
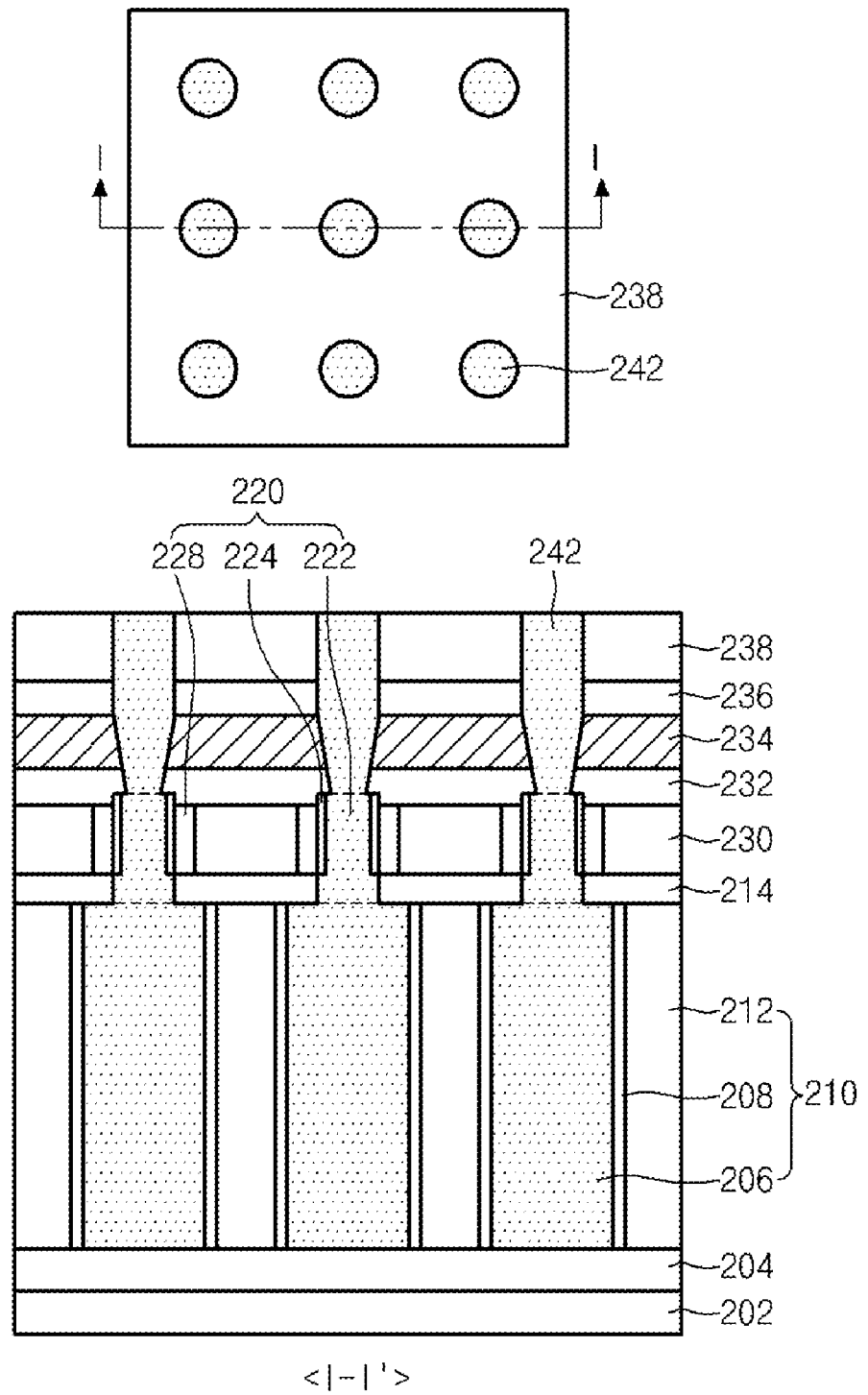
Figure 2O:
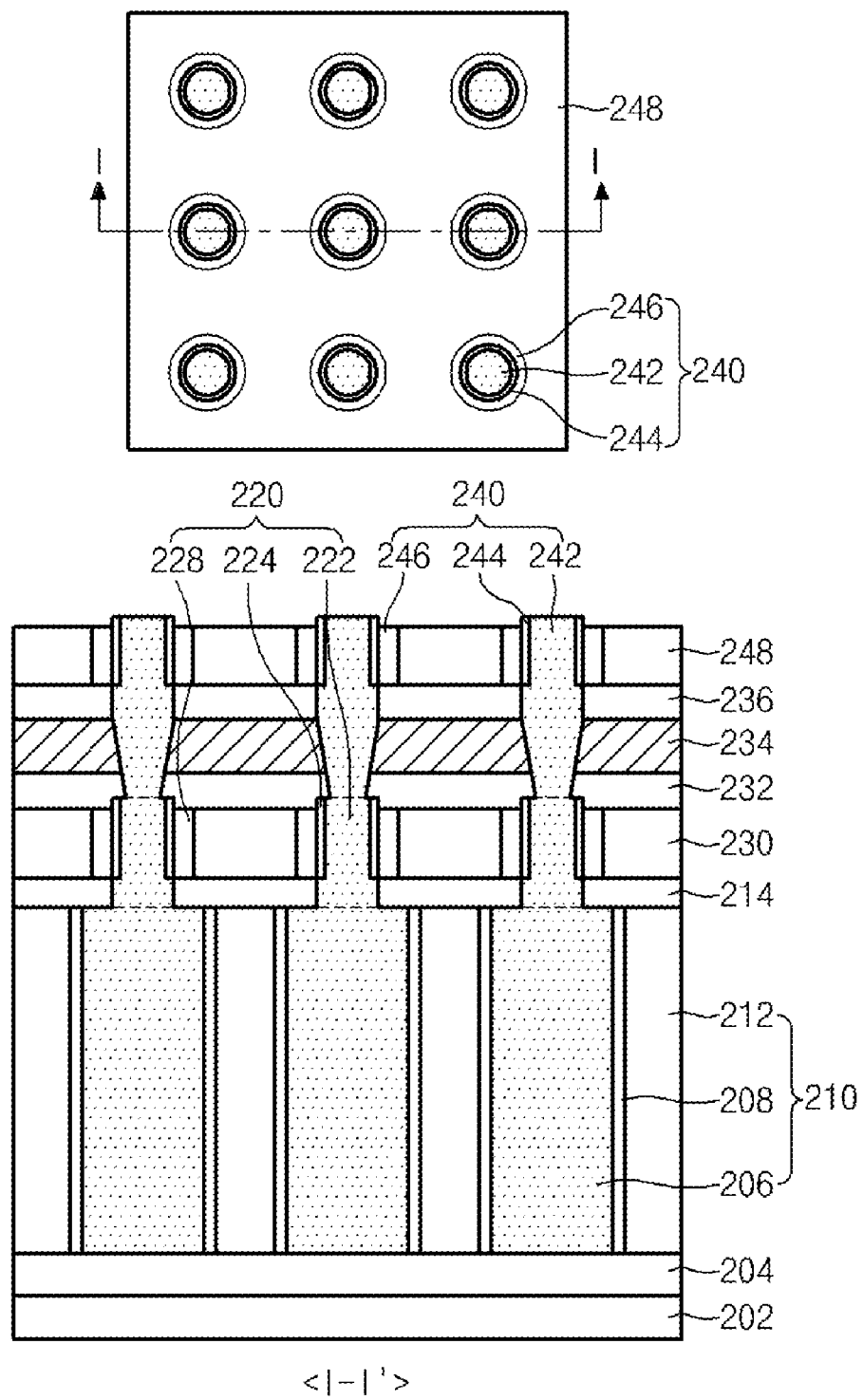
Figure 2P:
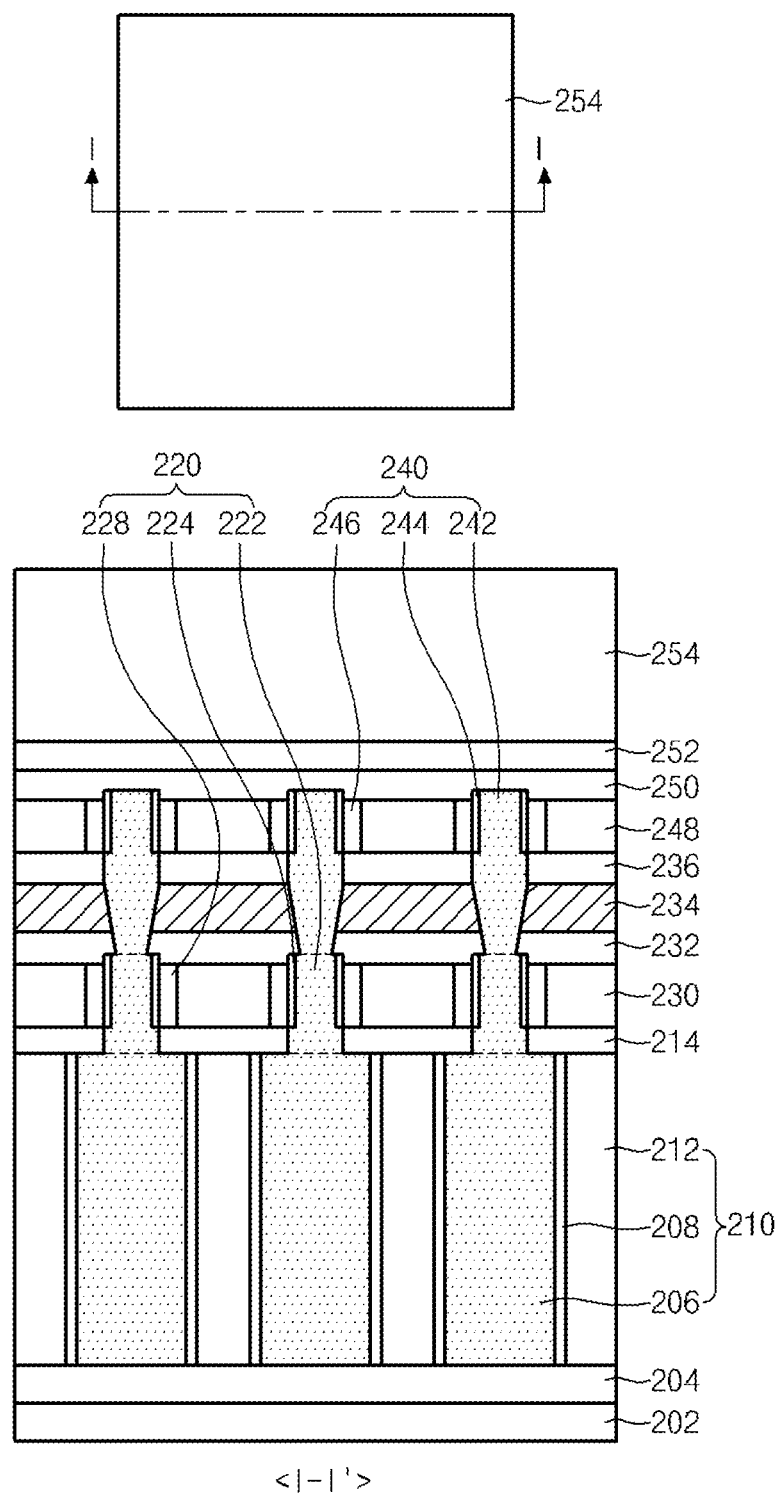
Figure 2Q:
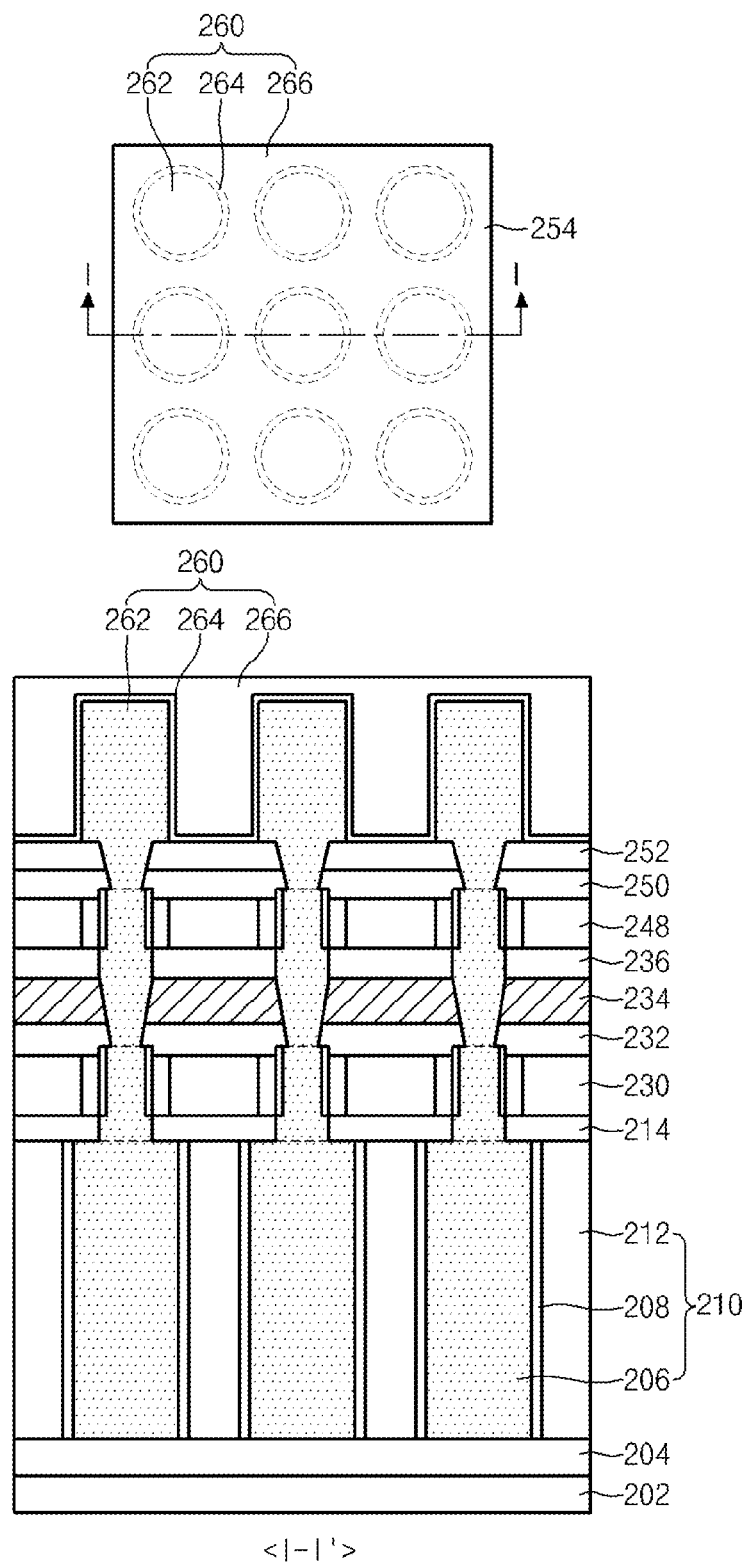

FIGS. 2A to 2Q are plan views and cross-sectional views illustrating a method for manufacturing a semiconductor memory device according to an embodiment of the present invention.

Referring to FIG. 2A, the semiconductor memory device is manufactured using a silicon on insulator (SOI) substrate 200 which includes an upper silicon layer 206, a lower silicon layer 202, and an insulation layer 204 formed between the upper and lower silicon layers 206 and 202.

Referring to FIG. 2B, the upper silicon layer 206 of the SOI substrate 200 is patterned in the form of a pillar so that the insulation layer 204 is exposed. As a smaller-sized silicon pillar is formed by a double patterning technology (DPT) process when the upper silicon layer 206 is patterned, a planar area occupied by unit cells contained in the semiconductor memory device is gradually reduced. In this case, the reason why the upper silicon layer 206 is etched to expose the insulation layer 204 is to separate unit cells to be formed in a lower layer from one another, and is to allow the separated unit cell to be used as an electrode of a capacitor.

Referring to FIG. 2C, a dielectric layer 208 is formed over the upper silicon layer 206 shaped in the pillar. After that, a conductive material 211 is deposited over the dielectric layer 208 and the insulation layer 204. For example, TiN may be used as the conductive material 211.

Referring to FIG. 2D, a chemical mechanical polishing (CMP) process is performed in such a manner that the upper silicon layer 206 is exposed by etching the conductive material 211, such that a plate electrode 212 is formed.

Through the above-mentioned processes, a first capacitor 210 for a unit cell to be formed in the lower layer can be formed, wherein the first capacitor 210 includes the pillar-shaped upper silicon layer 206 used as an electrode, the dielectric layer 208, and the plate electrode 212.

Referring to FIG. 2E, first and second insulation layers 214 and 216 formed of insulation materials having different etch selectivity are sequentially deposited over the first capacitor 210. In this case, the first insulation layer 214 electrically isolates the plate electrode 212 of the first capacitor 210 from a first cell transistor 220 to be formed at an upper part. The second insulation layer 216 forms the first cell transistor 220, and is deposited with a thickness corresponding to the height of a word line coupled to the unit cell. In fact, the second insulation layer 216 may be partially damaged or lost by a planarization process, an etching process, or a cleaning process, etc. that are subsequently performed. Therefore, the second insulation layer 216 may be deposited to be thicker than the word line by 100□ to 200□

Referring to FIG. 2F, the second insulation layer 216 and the first insulation layer 214 are partially etched, such that a hole 218 is formed to allow the upper silicon layer 206 serving as the electrode of the first capacitor 210 to be exposed. In this case, in order to electrically isolate the plate electrode 212 of the first capacitor 210 from the first cell transistor 220 to be formed at the upper part, a planar area of the hole 218 should be smaller than that of the upper silicon layer 206.

Referring to FIG. 2G, a pillar-shaped first channel region 222 filling the hole 218 is formed from the exposed upper silicon layer 206 using an epitaxial growth method. After performing the epitaxial growth, a planarization process is performed such that the second insulation layer 216 is exposed. Herein, the first channel region 222 forms a body of the first cell transistor 220 (see FIG. 2J).

Referring to FIG. 2H, the second insulation layer 216 is removed such that the first insulation layer 214 is exposed. For example, in order to remove the second insulation layer 216 deposited between fine patterns, a wet etch method or a reactive ion etch method may be used. In this case, the second insulation layer 216 can be removed using the difference in etch selectivity between the first insulation layer 214 and the second insulation layer 216. However, according to another embodiment of the present invention, a thin etch stop layer (not shown) is formed between the first insulation layer 214 and the second insulation layer 216, such that the etch stop layer may be used as a reference when the second insulation layer 216 is removed.

In the meantime, if the second insulation layer 216 is removed, the pillar-shaped first channel region 222 is exposed. An oxidation process is performed on the exposed first channel region 222, such that a first gate oxide layer 224 is formed by oxidizing an exposed surface of the first channel region 222.

Referring to FIG. 2I, a gate electrode material 226 is deposited between the first channel regions 222 enclosed by the first gate oxide layer 224, and is then planarized, such that the top surface of the first channel region 222 is exposed. For example, a conductive material such as polysilicon or TiN may be used as the gate electrode material 226.

Referring to FIG. 2J, the gate electrode material 226 is patterned such that a first word line 228 is formed. A third insulation layer 230 is buried in an empty space between the first word lines 228. In this case, a reflow process or a CMP process for planarization may be selectively carried out.

Through the above-mentioned processes, the first transistor 220, which includes the first channel region 222, the first gate oxide layer 224 and the first word line 228, can be formed over the first capacitor 210. In this case, the first capacitor 210 formed over the insulation layer 204 and the first transistor 220 form a single unit cell.

Referring to FIG. 2K, a fourth insulation layer 232 is deposited over the first transistor 220, and a bit line 234 is formed over the fourth insulation layer 232. For example, the bit line 234 may be comprised of several conductive layers (e.g., TiN, W and TIN layers). The fourth insulation layer 232 is used to electrically isolate the first word line 228 of the first transistor 220 from the bit line 234.

Referring to FIG. 2L, a fifth insulation layer 236 is deposited over the bit line 234.

According to one embodiment of the present invention, because a conductive material is deposited over the fourth insulation layer 232 and patterned using a mask, and then the fifth insulation layer 236 is deposited on the conductive material pattern, the bit line 234 and its neighboring bit line can be electrically isolated from each other. Meanwhile, according to another embodiment of the present invention, the fourth insulation layer 232 may be deposited and then partially etched to form a trench, and a conductive material may be buried in the trench, such that the bit line 234 may be formed, and the fifth insulation layer 236 may be deposited. The thickness of the fourth or fifth insulation layer 232 or 236 may be changed according to various embodiments capable of forming the bit line 234.

Referring to FIG. 2M, a sixth insulation layer 238 is formed over the fifth insulation layer 236. The sixth insulation layer 238 is very similar in function to the second insulation layer 216 used in the process for forming the first cell transistor 220. The sixth insulation layer 238 may be deposited to be thicker than the word line by 100□ to 200□.

Referring to FIG. 2N, an etching process for exposing the first channel region 222 is performed to form a hole (not shown) where a second channel region 242 is to be formed. In order to expose the first channel region 222, the etching process is performed using an etch mask defining the second channel region 242, such that the sixth insulation layer 238, the fifth insulation layer 236, the bit line 234 and the fourth insulation layer 232 can be sequentially etched. Then, the epitaxial growth is performed from the exposed first channel region 222, such that the second channel region 242 is formed to fill the hole.

In this case, the second channel region 242 is used as a bit line contact for coupling one side of a source/drain region of the first transistor 220 to the bit line 234, and also used as another bit line contact for coupling one side of a source/drain region of a second transistor to be formed in a subsequent process to the bit line 234.

In the meantime, only the first channel region 222 should be exposed without exposure of the first word line 228 in the etching process for forming the hole for formation of the second channel region 242, such that the second channel region 242 may be formed to be smaller than the first channel region 222 in order to achieve a process margin. However, according to this embodiment of the present invention, in the etching process for forming the second channel region 242, the hole size obtained at the position of either the sixth insulation layer 238 or the fifth insulation layer 236 is greater than the hole size obtained at the position of the bit line 234 formed of a metal. Therefore, the process margin can be guaranteed even though the second channel region 242 is not reduced in size, such that the second channel region 242 having the same size as that of the first channel region 222 can be formed. As a result, the unit cells contained in the semiconductor memory device may be formed to have the same size, such that the operation stability is not decreased.

Referring to FIG. 2O, the sixth insulation layer 238 is removed, and a second oxide layer 244 and a second word line 246 enclosing the second channel region 242 are formed. Then, a seventh insulation layer 248 is formed between the second word lines 246. As a result, a second cell transistor 240 is formed over the bit line 234, wherein the second cell transistor 240 includes the second channel region 242, the second gate oxide layer 244 and the second word line 246.

In this case, the method for forming the second gate oxide layer 244 and the second word line 246 is similar to the afore-mentioned method for forming the first gate oxide layer 224 and the first word line 228 shown in FIGS. 2H to 2J. Therefore, a detailed description thereof is omitted for convenience of description.

Referring to FIG. 2P, an eighth insulation layer 250 and an etch stop layer 252 are formed over the second cell transistor 240. In accordance with one embodiment of the present invention, in order to substantially prevent a capacitor formed over the second cell transistor 240 from being electrically coupled to the second word line, 246, the second word line 246 and the seventh insulation layer 248 can be etched so that a part of an upper portion of the second channel region 242 protrudes from the top surface of the second word line 246 and the seventh insulation layer 248. Then, the eighth insulation layer 250 is formed such that a step height of the second channel region 242 can be removed.

Meanwhile, the etch stop layer 252 formed over the eighth insulation layer 250 may be adapted to protect a lower structure and control an etched depth in a process for forming a capacitor over the second cell transistor 240. A ninth insulation layer 254 is formed over the etch stop layer 252. Here, the ninth insulation layer 254 may be formed with a thickness corresponding to the height of the capacitor formed over the second cell transistor 240. In particular, assuming that the capacitor formed at an upper part has the same structure as that of the first capacitor 210 formed at the lower part, the upper capacitor may have a thickness corresponding to the height of the upper silicon layer 206 so as to achieve the operation stability of the semiconductor memory device.

Referring to FIG. 2Q, a second capacitor 260 is formed over the second cell transistor 240. The second cell transistor 240 and the second capacitor 260 may form a unit cell over the bit line 234. As described above, the method for manufacturing the semiconductor memory device according to one embodiment of the present invention may form a cell array in which several unit cells are vertically arranged over the semiconductor substrate 200. Assuming that two unit cells are formed in multiple layers as described above, although one unit cell has the same planar area as that of the conventional unit cell, an actual planar area corresponding to one unit cell may be cut in half in consideration of the number of unit cells contained in the overall cell array.

In accordance with one embodiment of the present invention, the ninth insulation layer 254, the etch stop layer 252 and the eighth insulation layer 250 are partially etched to expose the channel region 242 of the second transistor 240. Thereafter, one side electrode 262 of the second capacitor 260 is formed through the epitaxial growth from the channel region 242 of the second transistor 240. Then, the ninth insulation layer 254 is removed, a dielectric layer 264 is formed on the one side electrode 262 of the second capacitor 260, and a conductive material is buried in a space between the electrodes 262, such that the other side electrode 266 of the second capacitor 260 is formed. In the case where the second capacitor 260 is formed through the epitaxial growth, the second capacitor 260 may be formed to have a structure or electrical property similar to that of the first capacitor 210 formed under the bit line 234, such that the operation stability of the semiconductor memory device can be increased. At this time, the electrode 262 of the second capacitor 260 may be configured in the form of a silicon pillar.

Figure 3:
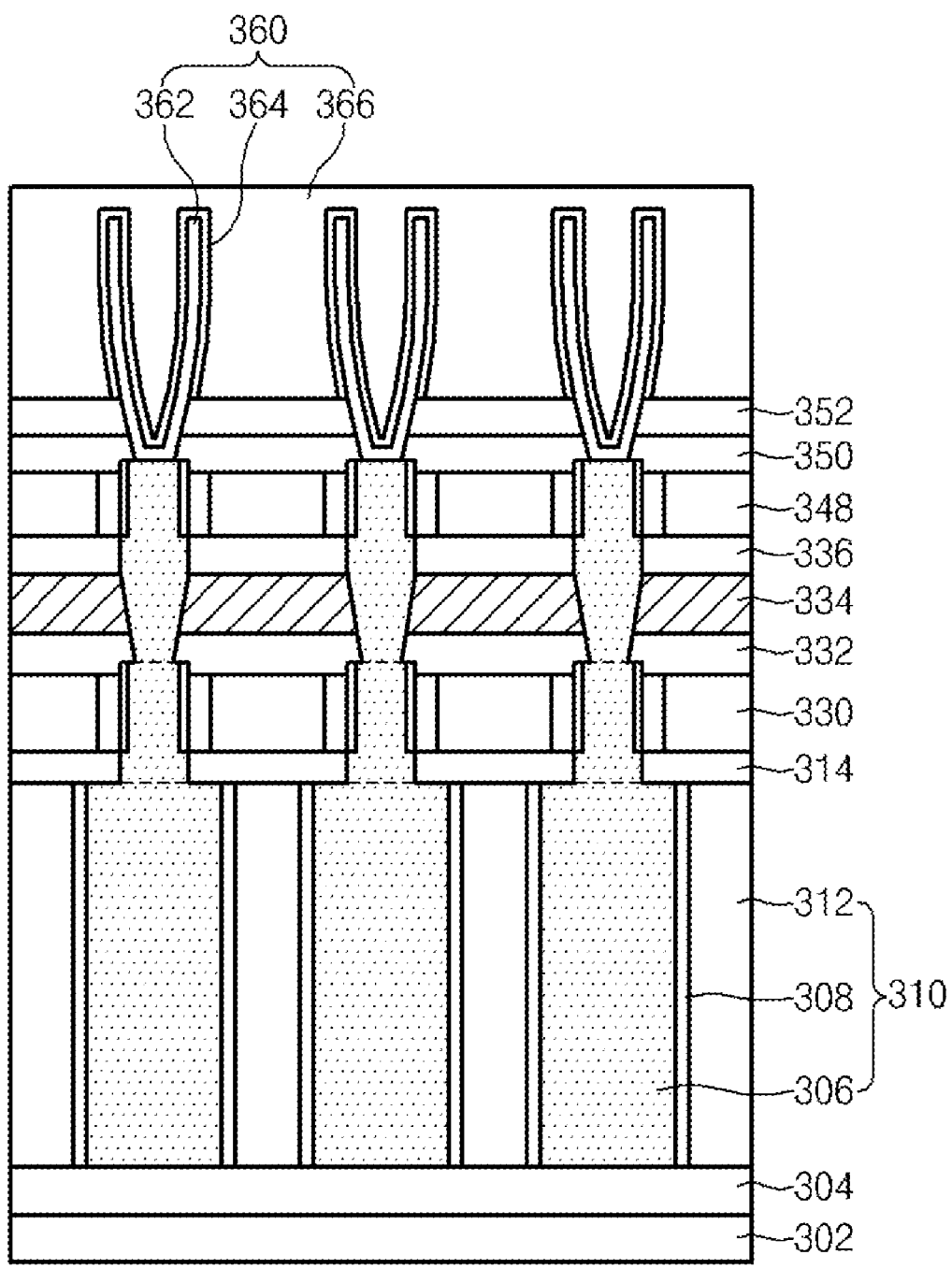
FIG. 3 is a cross-sectional view illustrating a method for manufacturing a semiconductor memory device according to another embodiment of the present invention.

FIG. 3 is a cross-sectional view illustrating a method for manufacturing a semiconductor memory device according to another embodiment of the present invention.

Referring to FIG. 3, an insulation layer 350 deposited over a bit line 334 is partially etched to form a second capacitor 360, such that a contact hole (not shown) is formed. Thereafter, after a lower electrode material 362 is deposited at a sidewall and bottom of the contact hole, the ninth insulation layer may be removed, and a dielectric layer 364 and a conductive material 366 may then be deposited. In this case, the second capacitor 360 has the cylindrical lower electrode 362, such that it is different in structure from the first capacitor 310. However, in order to achieve the operation stability of the semiconductor memory device, the height and the planar area of the second capacitor 360 can be adjusted, and the second capacitor 360 is formed in such a manner that the electrical property such as capacitance is substantially the same as that of the first capacitor 310.

In conclusion, although a capacitor contained in the upper unit cell forming a multi-layered structure is substantially the same in shape as the lower unit cell or the upper unit cell is different in shape from that of the lower unit cell also forming the multi-layered structure, the upper and lower unit cells can be controlled to have the same electrical characteristics (e.g., capacitance). This allows the production costs required for the manufacturing process to be reduced. For example, a method for forming a capacitor using a trench can be applied to a capacitor contained in the lower unit cell. It is not necessary for the capacitor contained in the upper unit cell to be shaped only as a specific format, for example, a cylindrical shape or concave structure. All types of manufacturing methods for allowing the capacitor of the upper unit cell to have the same electrical characteristics as those of the capacitor of the lower unit cell can be made with the embodiments of the present invention.

As described above, in accordance with the embodiments of the present invention, although one unit cell occupies a $4F^2$-sized area, since two unit cells shaped as the double-layered structure are respectively formed in upper and lower parts, the area substantially occupied by one unit cell is denoted by $2F^2$. The above-mentioned embodiment of the present invention can manufacture the semiconductor memory device having a $2F^2$-sized unit cell, the integration degree of which is about two times higher than that of a conventional semiconductor memory device having a $4F^2$-sized unit cell which has a higher integration degree as compared to the other semiconductor memory device having a $6F^2$-sized unit cell. Ultimately, in accordance with the embodiments of the present invention, the number of net dies can be about doubled as compared to that of the semiconductor memory device having the $4F^2$-sized unit cell, such that production costs per die can be cut in about half.

As apparent from the above description, the embodiments of the present invention allows a plurality of transistors and capacitors contained in a plurality of unit cells to be configured in a double-layered structure wherein the transistors and the capacitors are arranged at upper and lower positions from a semiconductor substrate, differently from the conventional semiconductor memory device wherein transistors and capacitors contained in a unit cell are formed at the same height on the basis of the semiconductor substrate. In accordance with the embodiments of the present invention, the unit cell having the $2F^2$ size smaller than the $8F^2$, $6F^2$, or $4F^2$ size can be formed, such that the integration degree of the semiconductor memory device can be increased two times or more.

Furthermore, an embodiment of the present invention provides a method for reducing an area occupied by the unit cells contained in the semiconductor memory device, such that the size of the semiconductor memory device can also be reduced. As a result, the number of semiconductor memory devices acquired from one wafer can be increased, resulting in a reduction of production costs of the semiconductor memory device.

The above embodiments of the present invention are illustrative and not limitative. Various alternatives and equivalents are possible. The invention is not limited by the type of deposition, etching polishing, and patterning steps described herein. Nor is the invention limited to any specific type of semiconductor device. For example, the present invention may be implemented in a dynamic random access memory (DRAM) device or non volatile memory device. Other additions, subtractions, or modifications are obvious in view of the present disclosure and are intended to fall within the scope of the appended claims.

What is claimed is:

1. A method for manufacturing a semiconductor device, the method comprising:
   providing a substrate;
   forming a first unit cell over the substrate;
   forming a second unit cell over the first unit cell; and
   forming a bit line over the first unit cell,
   wherein forming the first unit cell over the substrate includes:
      forming a first capacitor over the substrate; and
      forming a first transistor of a vertical type over the first capacitor,
   wherein forming the first capacitor includes:
      forming first and second silicon pillars over the substrate;
      forming a dielectric layer enclosing the first and second silicon pillars and defining a space; and
      depositing a conductive material within the space defined by the dielectric layer, and
   wherein the first and second unit cells define a multi-layered cell arrangement having at least two unit cells in a vertical arrangement.

2. The method according to claim 1, wherein the substrate includes an insulation layer provided between first and second semiconductor layers.

3. The method according to claim 2, wherein the substrate is a silicon on insulator (SOI) substrate.

4. The method according to claim 2, wherein the substrate includes an insulation region formed by implanting ions into a predetermined depth of the substrate.

5. The method according to claim 1, wherein the first unit cell is formed below the bit line and the second unit cell formed above the bit line.

6. The method according to claim 5, wherein each of the first unit cell and the second unit cell occupies a 4F2-sized planar area, the F being a critical dimension of the device.

7. The method according to claim 1, wherein forming the first unit cell further includes:

forming an insulation layer between the first capacitor and the first transistor.

8. The method according to claim 7, wherein forming the vertical-type first transistor includes:
exposing the first and second silicon pillars by etching the insulation layer;
growing silicon on the first and second silicon pillars to form a first channel region at least on the first silicon pillar;
forming a gate oxide layer enclosing the first channel region; and
forming a first word line enclosing the gate oxide layer.

9. The method according to claim 1, wherein forming the bit line over the first unit cell includes:
depositing an insulation layer over the first unit cell;
forming a trench in the insulation layer; and
filling the trench with conductive material.

10. The method according to claim 1, wherein forming the bit line over the first unit cell includes:
depositing an insulation layer over the first unit cell;
forming a plurality of conductive layers over the insulation layer;
patterning the plurality of conductive layers; and
depositing an insulation material over the patterned conductive layers.

11. The method according to claim 1, further comprising:
forming a bit line contact for coupling the first unit cell and the second unit cell to the bit line.

12. The method according to claim 1, wherein forming the second unit cell over the bit line includes:
forming a second transistor of a vertical type over the bit line;
forming an insulation layer over the second transistor; and
forming a second capacitor coupled to the second transistor over the insulation layer.

13. The method according to claim 12, wherein a planar area and a height of the second capacitor are adjusted such that the second capacitor has substantially the same capacitance as that of the first capacitor.

14. A method for manufacturing a semiconductor device, the method comprising:
providing a substrate;
forming a first unit cell over the substrate, the first unit cell including a first transistor and a first capacitor;
forming a second unit cell over the first unit cell; and
forming a bit line over the first unit cell, wherein the second unit cell is formed over the bit line,
wherein forming the second unit cell over the bit line includes:
forming a second transistor of a vertical type over the bit line;
forming an insulation layer over the second transistor; and
forming a second capacitor coupled to the second transistor over the insulation layer,
wherein forming the vertical-type second transistor includes:
exposing the first unit cell by forming a hole extending through the bit line;
forming a second channel region provided in the hole through the epitaxial growth from the first unit cell; and
forming a second gate oxide layer and a second word line enclosing the second channel region over the bit line, and
wherein the first and second unit cells define a multi-layered cell arrangement having a least two unit cells in a vertical arrangement.

15. The method according to claim 14, wherein forming the second capacitor includes:
forming a contact hole exposing the second channel region by etching the insulation layer;
forming a silicon pillar buried in the contact hole through the epitaxial growth from the second channel region;
removing the remaining portion of the insulation layer;
forming a dielectric layer enclosing the silicon pillar; and
depositing a conductive material over the dielectric layer to form an electrode.

16. The method according to claim 14, wherein forming the second capacitor includes:
forming a contact hole exposing the second channel region by etching the insulation layer;
depositing a conductive material on a sidewall and bottom of the contact hole to form a first electrode;
removing the insulation layer and depositing a dielectric layer over the first electrode; and
depositing a conductive material over the dielectric layer to form a second electrode.

* * * * *